(12) United States Patent
Qiao et al.

(10) Patent No.: US 12,328,901 B2
(45) Date of Patent: Jun. 10, 2025

(54) BIDIRECTIONAL CONDUCTION TRENCH GATE POWER MOS DEVICE AND MANUFACTURING METHOD THEREOF

(71) Applicant: University of Electronic Science and Technology of China, Chengdu (CN)

(72) Inventors: Ming Qiao, Chengdu (CN); Yong Chen, Chengdu (CN); Wenliang Liu, Chengdu (CN); Dong Fang, Chengdu (CN); Fabei Zhang, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 501 days.

(21) Appl. No.: 17/714,176

(22) Filed: Apr. 6, 2022

(65) Prior Publication Data

US 2023/0170411 A1    Jun. 1, 2023

(30) Foreign Application Priority Data

Nov. 29, 2021 (CN) .......................... 202111473730.X

(51) Int. Cl.
   *H10D 30/66* (2025.01)
   *H01L 21/265* (2006.01)
   (Continued)

(52) U.S. Cl.
   CPC ..... *H10D 30/668* (2025.01); *H01L 21/26513* (2013.01); *H01L 21/266* (2013.01);
   (Continued)

(58) Field of Classification Search
   CPC .. H01L 29/7813; H01L 21/761; H01L 29/407
   See application file for complete search history.

(56) References Cited

U.S. PATENT DOCUMENTS

| | | | |
|---|---|---|---|
| 2012/0025305 A1* | 2/2012 | Takeda | H01L 29/7825 257/334 |
| 2014/0110723 A1* | 4/2014 | Ikegami | H01L 21/8213 257/77 |

(Continued)

*Primary Examiner* — Eliseo Ramos Feliciano
*Assistant Examiner* — Mikka Liu
(74) *Attorney, Agent, or Firm* — Bayramoglu Law Offices LLC

(57) ABSTRACT

A bidirectional conduction trench gate power MOS device and a manufacturing method thereof are provided. A gate electrode, a source electrode and a drain electrode are formed on a surface of a silicon wafer to realize a bidirectional conduction and bidirectional blocking power MOS device used in an application environment such as lithium battery BMS protection. A device structure of the bidirectional conduction trench gate power MOS device has advantages compared with double-transistor series connection used in a conventional BMS and other structures for realizing a bidirectional conduction: firstly, the bidirectional conduction trench gate power MOS device needs to occupy half or less area compared with a conventional mode, improving a degree of integration; secondly, the device structure has a simple manufacturing process and a low manufacturing cost reducing manufacturing problems; thirdly, the drain electrode and the source electrode of the device structure are exchanged to realize a symmetrical structure.

20 Claims, 14 Drawing Sheets

(51) Int. Cl.
*H01L 21/266* (2006.01)
*H01L 21/761* (2006.01)
*H10D 30/01* (2025.01)
*H10D 62/10* (2025.01)
*H10D 62/17* (2025.01)
*H10D 64/00* (2025.01)

(52) U.S. Cl.
CPC ....... *H01L 21/761* (2013.01); *H10D 30/0297* (2025.01); *H10D 62/109* (2025.01); *H10D 62/393* (2025.01); *H10D 64/117* (2025.01)

(56) References Cited

U.S. PATENT DOCUMENTS

| | | | |
|---|---|---|---|
| 2014/0264565 A1* | 9/2014 | Padmanabhan | H01L 29/7813 438/270 |
| 2021/0074853 A1* | 3/2021 | Wang | H01L 29/7831 |

* cited by examiner

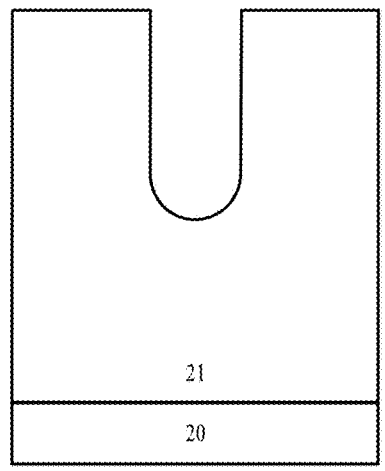
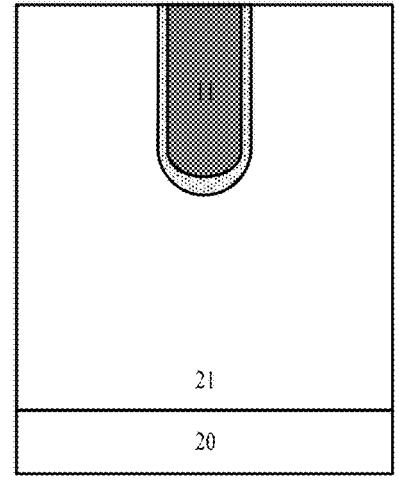
FIG. 19A          FIG. 19B
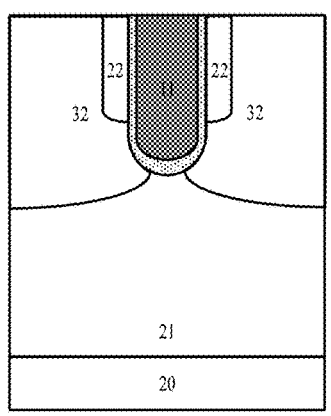
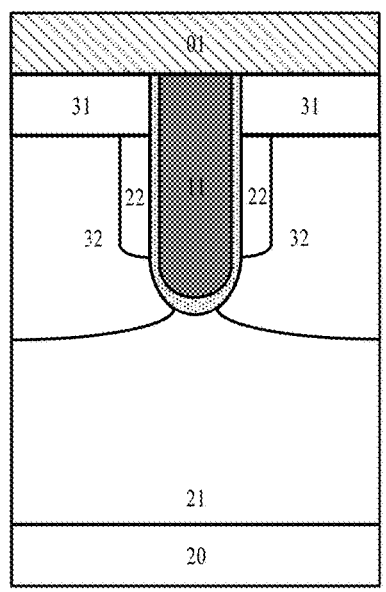
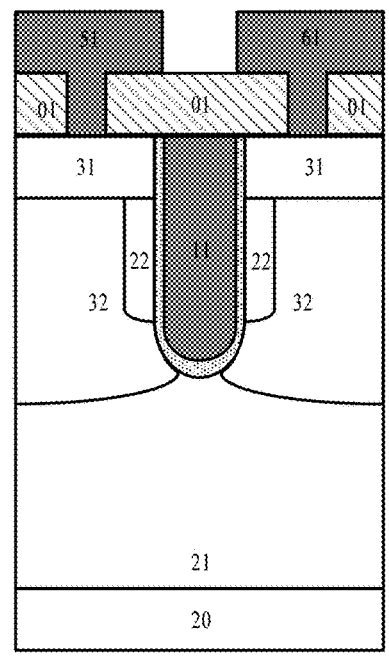
FIG. 19C          FIG. 19D          FIG. 19E

BIDIRECTIONAL CONDUCTION TRENCH GATE POWER MOS DEVICE AND MANUFACTURING METHOD THEREOF

CROSS REFERENCE TO THE RELATED APPLICATIONS

This application is based upon and claims priority to Chinese Patent Application No. 202111473730.X, filed on Nov. 29, 2021, the entire contents of which are incorporated herein by reference.

TECHNICAL FIELD

The present invention belongs to the field of semiconductor power device technology and mainly relates to a bidirectional power semiconductor device and a manufacturing method thereof.

BACKGROUND

With high integration, low on-resistance, fast switching speed and low switching loss, power MOS devices are widely used in various types of power management and switching conversion, and have broad development and application prospects. However, the unidirectional blocking and unidirectional conduction characteristics of power MOS devices caused by the asymmetric drain-source structure of conventional power MOS devices limit the application of power MOS devices.

In some low-power DC-DC converter ICs, lithium ion battery charging and discharging and other applications that require bidirectional blocking and bidirectional conduction, since no single device can be used as a bidirectional self-commutated switch, the bidirectional switch (BDS) is composed of commonly used solid state devices. In order to establish a composite BDS with bidirectional conduction capability, it is necessary to connect two discrete devices in anti-series, i.e. two unidirectional voltage devices or in anti-parallel, i.e. two unidirectional current devices, as shown in FIG. 1; The equivalent circuit for its application in a lithium-ion charge/discharge environment is shown in FIG. 2. However, on the one hand, this solution requires two large-area power MOS devices, which increases the cost and reduces the system integration; On the other hand, the series connection of two power MOS devices also greatly increases the on-resistance of the circuit and enlarges circuit loss and other problems. Another possibility option is through innovation of conventional vertical and lateral device structures, as shown in FIGS. 3, 4 and 5. The single trench double-gate power MOS structure shown in FIG. 3 is not significantly different from the conventional double-MOS conduction structure, only the cell size is reduced by introducing two gate electrodes in a single trench, however, a higher requirement for process manufacturing is put forward. However, the vertical trench gate power MOS device shown in FIG. 4 does not have low manufacturing cost and low process difficulty by introducing a double withstanding voltage pn junction in the vertical direction. The lateral planar gate power MOS device shown in FIG. 5 has a large on-resistance due to its large size and so on, which affects its application in a bidirectional conduction power switch.

SUMMARY

In order to solve the above-mentioned problems, a bidirectional conduction trench gate power MOS device and a manufacturing method thereof are provided in the present invention. The requirements of a bidirectional conduction and bidirectional blocking with interchangeable source and drain electrodes are realized under the area of a single power MOS transistor by the bidirectional conduction power MOS structure proposed in the present invention.

In order to achieve the above-mentioned purpose of the invention, the technical solution of the present invention is as follows:

A bidirectional conduction trench gate power MOS device, comprising:

a second conductivity type heavily doped substrate 20, a second conductivity type lightly doped epitaxial layer 21 located on the second conductivity type heavily doped substrate 20, a trench located on the second conductivity type lightly doped epitaxial layer 21, and a first gate electrode polysilicon 11 located inside the trench, wherein a gate oxide layer 03 is sandwiched between the first gate electrode polysilicon 11 and the trench, and the thickness thereof is determined by a gate electrode working potential; and a first conductivity type lightly doped region 32 is located at two sides of the trench, wherein the bottom of the first conductivity type lightly doped region 32 is lower than the bottom of the trench; and a first conductivity type heavily doped region 31 is located on the surface of the first conductivity type lightly doped region 32; and the surface of the first conductivity type heavily doped region 31 is a dielectric layer 01, and a source electrode 51 and a drain electrode 61 are led out from the upper part of the dielectric layer 01.

As a preferred mode, the bottom of the trench is implanted and annealed to form a second conductivity type channel modulation region 23.

As a preferred mode, a split gate electrode polysilicon 13 is provided above the first gate electrode polysilicon 11 inside the trench.

As a preferred mode, a second conductivity type doped region 22 is provided inside the first conductivity type lightly doped region 32, and the second conductivity type doped region 22 is at the left side, the middle or the right side inside the first conductivity type lightly doped region 32.

As a preferred mode, a buried oxide layer 77 is provided between the second conductivity type heavily doped substrate 20 and the second conductivity type epitaxial layer 21.

As a preferred mode, the first gate electrode polysilicon 11 inside the trench is a stepped, or funnel-shaped, or U-shaped, or reduced surface field stepped oxide RSO type structure.

As a preferred mode, the source electrode and the drain electrode are interchanged.

As a preferred mode, the first conductivity type is n-type doping and the second conductivity type is p-type doping when the device is a N-type channel MOS; the first conductivity type is p-type doping and the second conductivity type is n-type doping when the device is a P-type channel MOS;

and/or a heavily doped doping concentration is greater than 1E19 and a lightly doped doping concentration is less than 1E18.

A method for manufacturing the bidirectional conduction trench gate power MOS device is also provided in the present invention, comprising the following steps:

step 1, selecting a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type epitaxial layer 21 to form a U-shaped trench, and forming the gate oxide layer 03 and a first gate electrode polysilicon 11 in the trench;

step 4, forming a first conductivity type lightly doped region 32 on the surface of the second conductivity type epitaxial layer 21 by implanting first conductivity type impurity ions one or more times, wherein the bottom of the first conductivity type lightly doped region 32 is lower than the bottom of the trench.

step 5, forming a first conductivity type heavily doped region 31 on the surface of the first conductivity type lightly doped region 32 by implanting first conductivity type impurity ions one or more times, wherein the bottom of the first conductivity type heavily doped region 31 is lower than the top of the first gate electrode polysilicon 11; and step 6, forming a dielectric layer 01 and a contact hole by a deposition, photolithography and etching process, performing surface metallizing, and forming a surface metal contact layer by a photolithography and etching process, in order to constitute a source electrode 51 and a drain electrode 61.

A second method for manufacturing the bidirectional conduction trench gate power MOS device is also provided in the present invention, comprising the following steps:

step 1, selecting a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type epitaxial layer 21 to form a U-shaped trench, and forming a sacrificial oxide layer in the trench;

step 4, forming a second conductivity type channel modulation region 23 by implanting second conductivity type impurity ions one or more times into a channel region at bottom of the trench, and then performing sacrificial oxygen etching;

step 5, forming a gate oxide layer 03 in the trench, and then depositing polysilicon into the trench to form a first gate electrode polysilicon 11;

step 6, forming a first conductivity type lightly doped region 32 on the surface of the second conductivity type epitaxial layer 21 by implanting first conductivity type impurity ions one or more times, wherein the bottom of the first conductivity type lightly doped region 32 is lower than the bottom of the trench;

step 7, forming a first conductivity type heavily doped region 31 on the surface of the first conductivity type lightly doped region 32 by implanting first conductivity type impurity ions one or more times, wherein the bottom of the first conductivity type heavily doped region 31 is lower than the top of the first gate electrode polysilicon 11; and step 8, forming a dielectric layer 01 and a contact hole by a deposition, photolithography and etching process, performing surface metallizing, and forming a surface metal contact layer by a photolithography and etching process, in order to constitute a source electrode 51 and a drain electrode 61.

The advantageous effects of the present invention are: the present invention provides a bidirectional conduction trench gate power MOS device and a manufacturing method thereof. Wherein a gate electrode, a source electrode and a drain electrode are formed on the surface of a silicon wafer so as to realize a bidirectional conduction and bidirectional blocking power MOS device, which can be used in an application environment such as lithium battery BMS protection. The device structure proposed in the present invention has the following advantages compared with double-transistor series connection used in the conventional BMS and other structures for realizing bidirectional conduction: firstly, the device proposed by the present invention only needs to occupy half or even less area compared with the conventional mode, greatly improving the degree of integration; secondly, the device structure proposed by the present invention has a simple manufacturing process and a low manufacturing cost, which reduces the manufacturing problems; thirdly, the drain electrode and the source electrode of the device structure proposed in the present invention can be exchanged to realize a symmetrical structure, simultaneously achieved a bidirectional conduction and bidirectional blocking in a real sense; fourthly, since the drain electrode, the source electrode and the gate electrode are all on the surface of the silicon wafer, the device structure proposed in the present invention is easy to integrate and increases the application environments.

BRIEF DESCRIPTION OF THE DRAWINGS

FIGS. 10A-10C are schematic diagrams corresponding to the bidirectional conduction trench gate power MOS device in embodiment 5. Wherein FIG. 10A, FIG. 10B, and FIG. 10C are respectively at the right side, the middle and the left side of the second conductivity type doped region 22 inside the first conductivity type lightly doped region 32.

FIGS. 19A-19E are process flow diagrams corresponding to the manufacturing method in embodiment 5.

Figure 1:
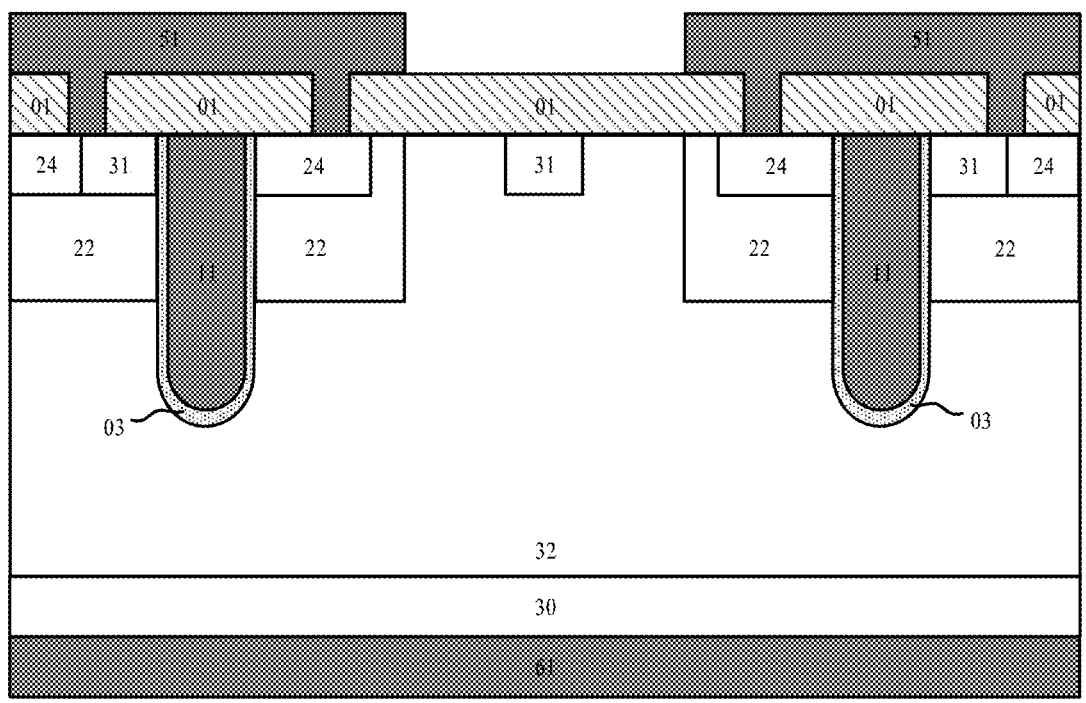
FIG. 1 is a schematic diagram showing the structure of a conventional drain electrode short connection MOS conduction device.
Figure 2:
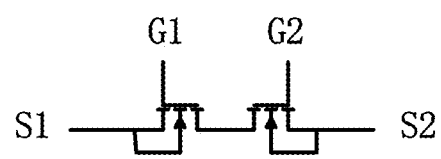
FIG. 2 is an equivalent circuit diagram of a conventional drain electrode short connection MOS.
Figure 3:
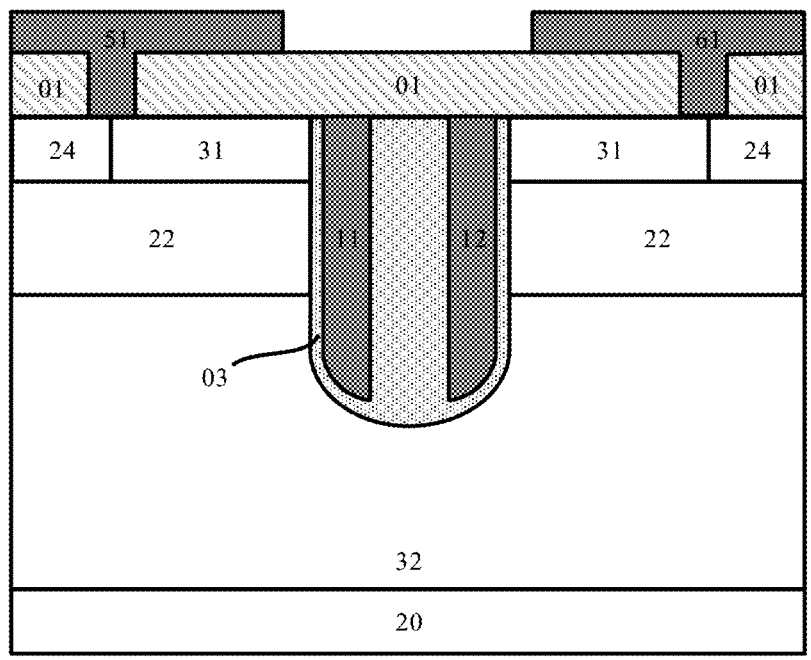
FIG. 3 is a schematic diagram of the structure of a single trench double-gate power MOS device.
Figure 4:
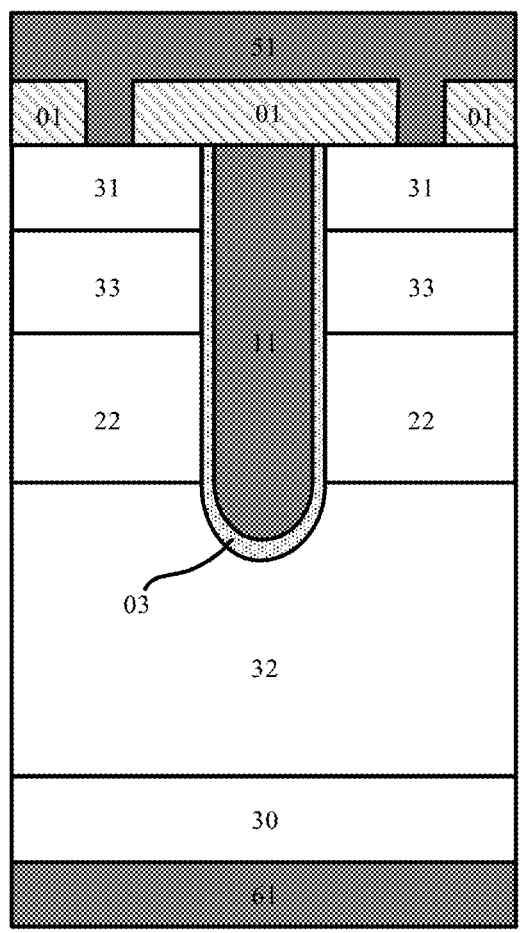
FIG. 4 is a schematic diagram of a vertical trench gate power MOS device.
Figure 5:
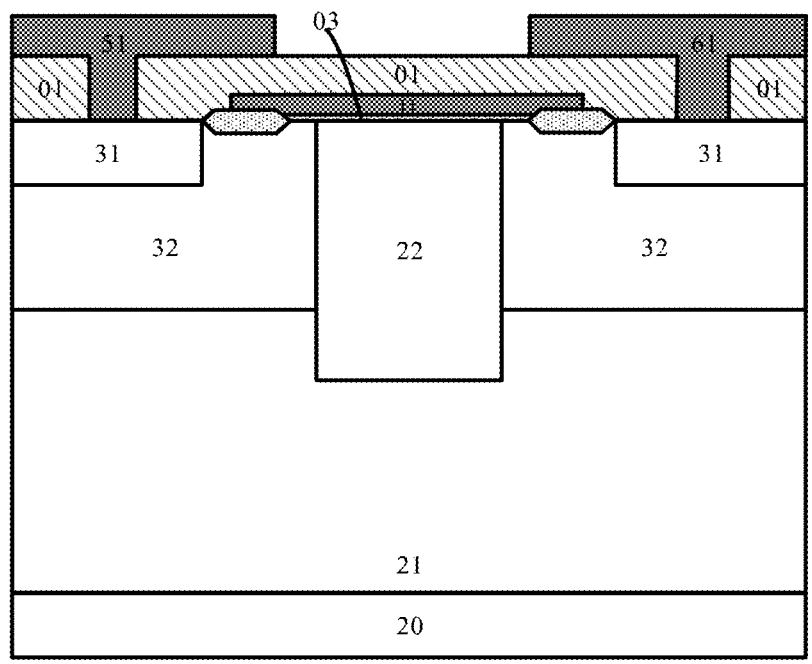
FIG. 5 is a schematic diagram of a lateral planar gate power MOS device.

In the drawings, the components identified by the reference numbers are listed as follows:

01 is a dielectric layer, 03 is a gate oxide layer, 11 is a first gate electrode polysilicon, 12 is a second gate electrode polysilicon, 13 is a split gate electrode polysilicon, 20 is a second conductivity type heavily doped substrate, 21 is a second conductivity type epitaxial layer, 22 is a second conductivity type doped region, 23 is a second conductivity type channel modulation region, 24 is a second conductivity type heavily doped region, 30 is a first conductivity type heavily doped substrate, 31 is a first conductivity type heavily doped region, 32 is a first conductivity type lightly doped region, 33 is a first conductivity type doped region, 51 is a source electrode, 61 is a drain electrode, and 77 is a buried oxide layer.

DETAILED DESCRIPTION OF THE EMBODIMENTS

The principles and features of the present invention are described below with reference to the drawings, and the examples are presented for purposes of illustration only and are not intended to limit the scope of the invention.

Embodiment 1

Figure 6:
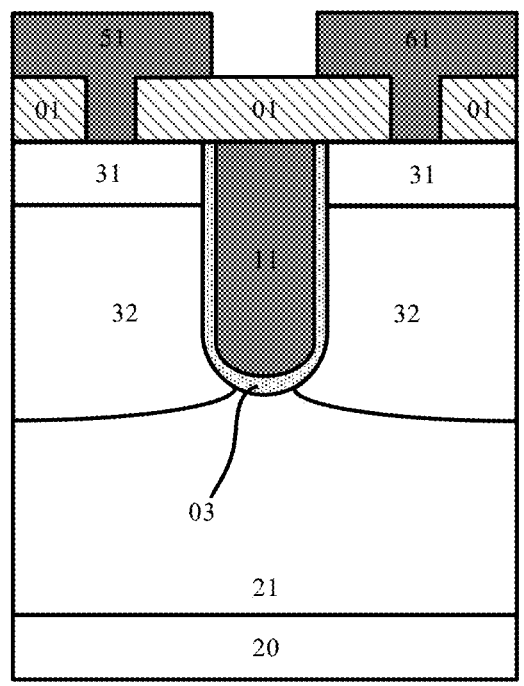
FIG. 6 is a schematic diagram showing the bidirectional conduction trench gate power MOS device proposed in embodiment 1 of the present invention.

As shown in FIG. 6, the present embodiment provides a bidirectional conduction trench gate power MOS device, comprising:

a second conductivity type heavily doped substrate 20, a second conductivity type lightly doped epitaxial layer 21 located on the second conductivity type heavily doped substrate 20, a trench located on the second conductivity type lightly doped epitaxial layer 21, and a first gate electrode polysilicon 11 located inside the trench, wherein a gate oxide layer 03 is sandwiched between the first gate electrode polysilicon 11 and the trench, and the thickness thereof is determined by a gate electrode working potential; and a first conductivity type lightly doped region 32 is located at two sides of the trench, wherein the bottom of the first conductivity type lightly doped region 32 is lower than the bottom of the trench; and a first conductivity type heavily doped region 31 is located on the surface of the first conductivity type lightly doped region 32; and the surface of the first conductivity type heavily doped region 31 is a dielectric layer 01, and a source electrode 51 and a drain electrode 61 are led out from the upper part of the dielectric layer 01.

Figure 17A:
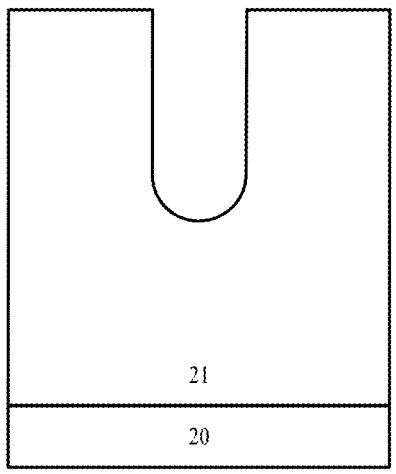
FIGS. 17A-17D are process flow diagrams corresponding to the manufacturing method in embodiment 1.
Figure 17B:
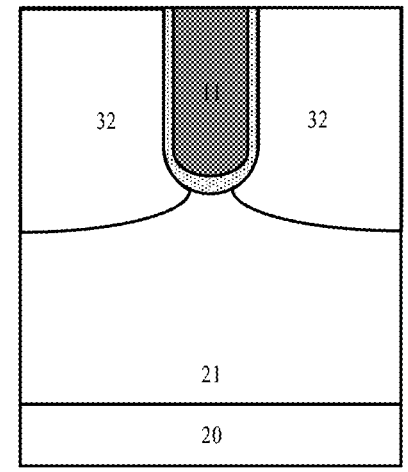
Figure 17C:
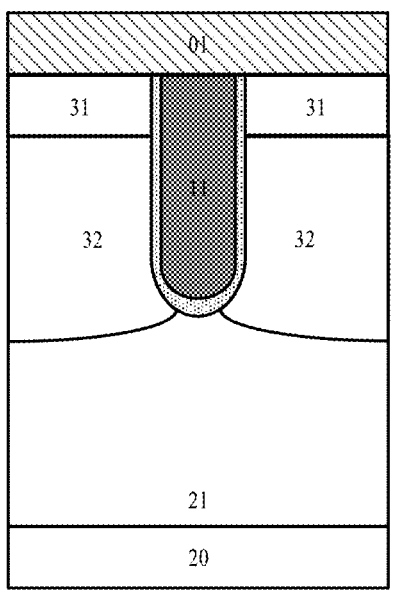
Figure 17D:
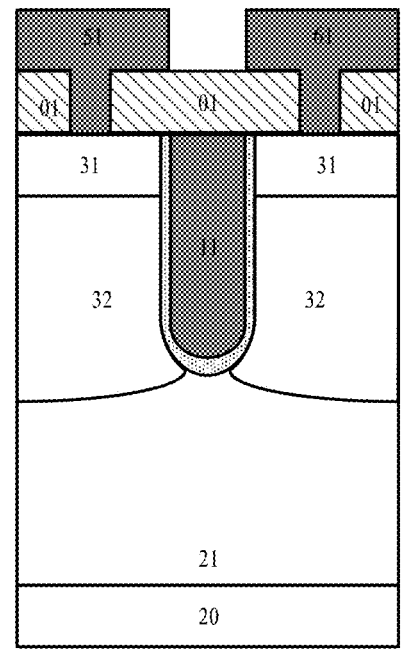

The present embodiment also provides a method of manufacturing the above-mentioned bidirectional conduction trench gate power MOS device, as shown in FIGS. 17A-17D. The method comprises the following steps:

step 1, a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type epitaxial layer 21 to form a U-shaped trench, as shown in FIG. 17A, and forming the gate oxide layer 03 and a first gate electrode polysilicon 11 in the trench;

step 4, forming a first conductivity type lightly doped region 32 on the surface of the second conductivity type epitaxial layer 21 by implanting first conductivity type impurity ions one or more times, wherein the bottom of the first conductivity type lightly doped region 32 is lower than the bottom of the trench, as shown in FIG. 17B;

step 5, forming a first conductivity type heavily doped region 31 as shown in FIG. 17C on the surface of the first conductivity type lightly doped region 32 by implanting first conductivity type impurity ions one or more times, wherein the bottom of the first conductivity type heavily doped region 31 is lower than the top of the first gate electrode polysilicon 11; and step 6, forming a dielectric layer 01 and a contact hole as shown in FIG. 17C by a deposition, photolithography and etching process, performing surface metallizing, and forming a surface metal contact layer by a photolithography and etching process, so as to constitute a source electrode 51 and a drain electrode 61, as in FIG. 17D.

Figure 21:
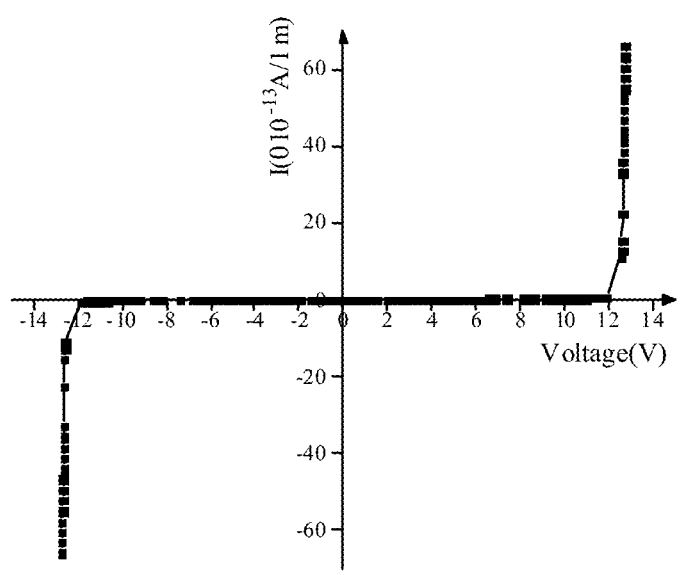
FIG. 21 is an I-V simulation curve of the bidirectional blocking corresponding to embodiment 1.

In a bidirectional conduction trench gate power MOS device proposed in the present invention, the drain electrode and the source electrode are both on the surface and are interchangeable, the high voltage can be endured by depletion of the epitaxial layer when the gate electrode is not applied with a potential and the channels of the MOS transistor are closed, no matter which electrode is applied with a high potential, thereby achieving the purpose of bidirectional blocking, as shown in the simulation curve of FIG. 21; when two channels of the MOS transistor are opened, the direction of the current will change with the direction of the voltage, thereby achieving the purpose of bidirectional current conduction. At the same time, the manufacturing cost and difficulty of the device structure are not large; and it only needs to occupy half or even less area compared with the conventional mode, greatly improving the degree of integration; and due to its particularity in the structure, the drift region resistance in conventional sense is reduced and the overall on-resistance is reduced. Again, the source, drain and gate electrode are all on the surface and thus may be used in an integrated application environment.

Embodiment 2

Figure 7:
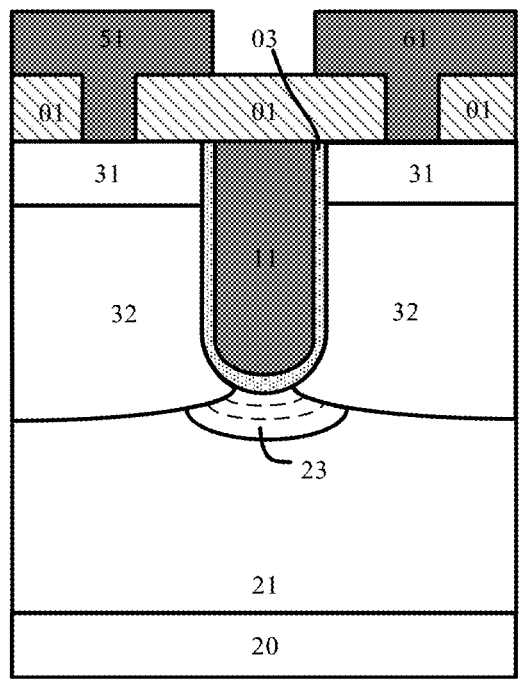
FIG. 7 is a schematic diagram showing the bidirectional conduction trench gate power MOS device proposed in embodiment 2 of the present invention.

As shown in FIG. 7, the present embodiment provides a bidirectional conduction trench gate power MOS device, and the difference between the present embodiment and embodiment 4 is that: the bottom of the trench is implanted and annealed to form a second conductivity type channel modulation region 23, and the energy magnitude thereof implanted one or more times can be different to form different depths, thereby effectively adjusting the threshold value, and preventing the channel region from penetrating.

Figure 18A:
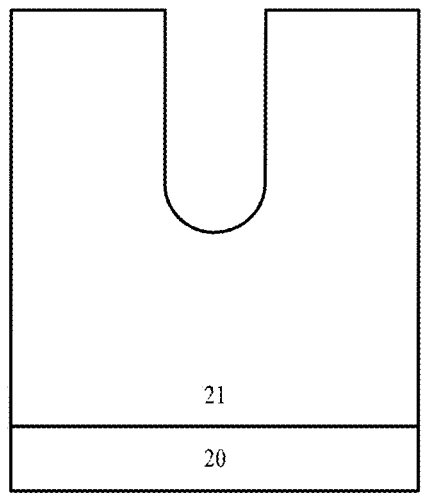
FIGS. 18A-18E are process flow diagrams corresponding to the manufacturing method in embodiment 2.
Figure 18B:
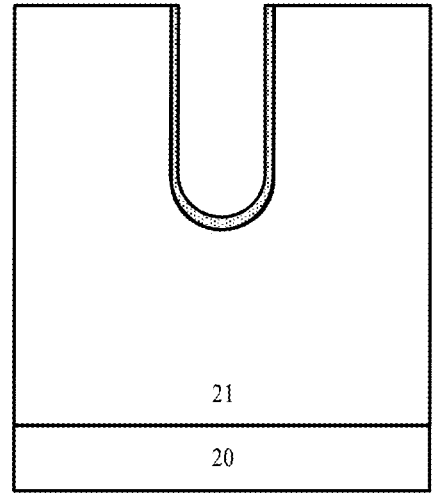
Figure 18C:
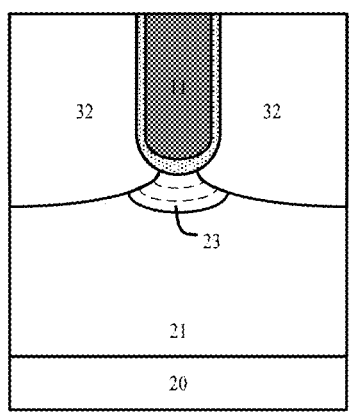
Figure 18D:
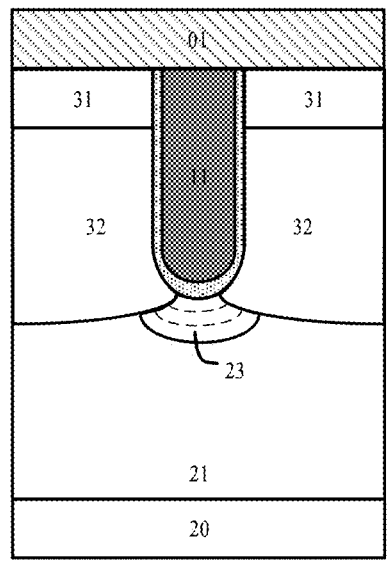
Figure 18E:
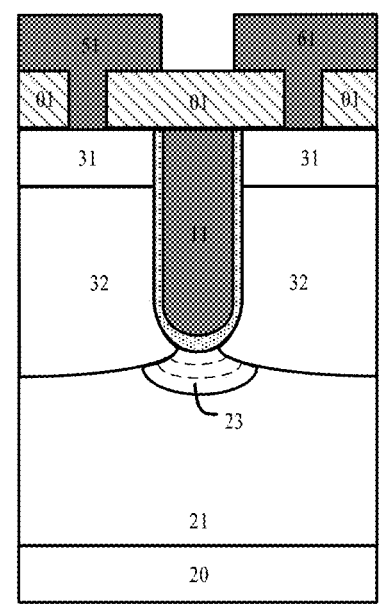

As shown in FIGS. 18A-18E, the present embodiment also provides a method for manufacturing the above-mentioned bidirectional conduction trench gate power MOS device, comprising the following steps:

step 1, selecting a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type epitaxial layer 21 to form a U-shaped trench, as shown in FIG. 18A, and forming a sacrificial oxide layer in the trench, as shown in FIG. 18B;

step 4, forming a second conductivity type channel modulation region 23 by implanting second conductivity type impurity ions one or more times into a channel region at bottom of the trench, and then performing sacrificial oxygen etching;

step 5, forming a gate oxide layer 03 in the trench, and then depositing polysilicon into the trench to form a first gate electrode polysilicon 11; as in FIG. 18C;

step 6, forming a first conductivity type lightly doped region 32 on the surface of the second conductivity type epitaxial layer 21 by implanting first conductivity type impurity ions one or more times, wherein the bottom of the first conductivity type lightly doped region 32 is lower than the bottom of the trench;

step 7, forming a first conductivity type heavily doped region 31 as shown in FIG. 18D on the surface of the first conductivity type lightly doped region 32 by implanting first conductivity type impurity ions one or more times, wherein the bottom of the first conductivity type heavily doped region 31 is lower than the top of the first gate electrode polysilicon 11; and step 8, forming a dielectric layer 01 and a contact hole as shown in FIG. 18D by a deposition, photolithography and etching process, performing surface metallizing, and forming a surface metal contact layer by a photolithography and etching process, in order to constitute a source electrode 51 and a drain electrode 61. As shown FIG. 18E.

Embodiment 3

Figure 8:
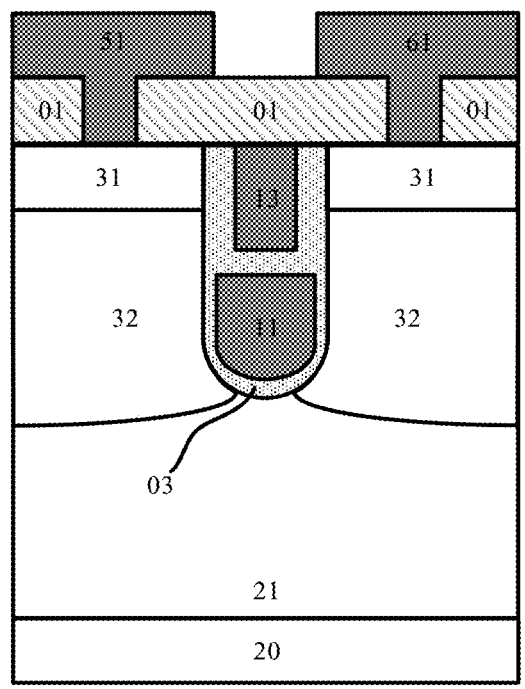
FIG. 8 is a schematic diagram showing the bidirectional conduction trench gate power MOS device proposed in embodiment 3 of the present invention.

As shown in FIG. 8, the present embodiment provides a bidirectional conduction trench gate power MOS device, and the difference between the present embodiment and embodiment 1 is that: a split gate electrode polysilicon 13 is provided above the first gate electrode polysilicon 11 inside the trench.

The split gate structure acts as an assisted depletion of the internal field plate, further improving the breakdown voltage of the device structure and further improving the overall on-resistance.

Embodiment 4

Figure 9:
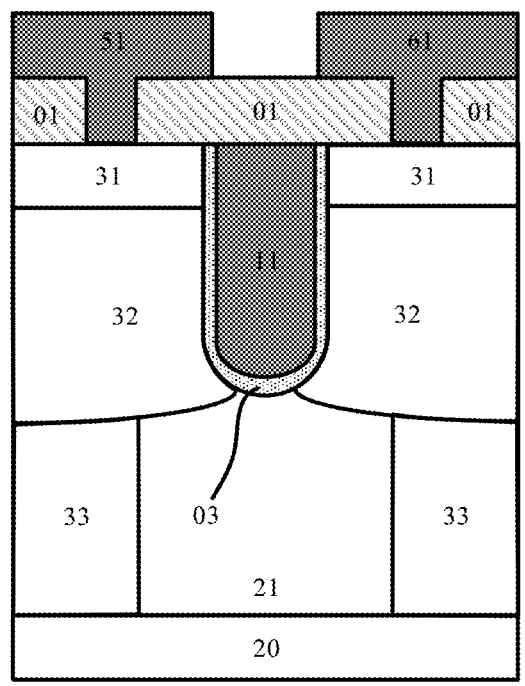
FIG. 9 is a schematic diagram showing the bidirectional conduction trench gate power MOS device proposed in embodiment 4 of the present invention.

The bidirectional conduction trench gate power MOS device is shown in FIG. 9, and the difference between the present embodiment and embodiment 1 is that: a first conductive type doped region 33 is introduced into the second conductive type lightly doped epitaxial layer 21, and the first conductive type doped region 33 is at two sides of the second conductive type lightly doped epitaxial layer 21, so that the on-resistance of the device can be further reduced under the same voltage level, and the switching loss of the device can be reduced.

Embodiment 5

Figure 10A:
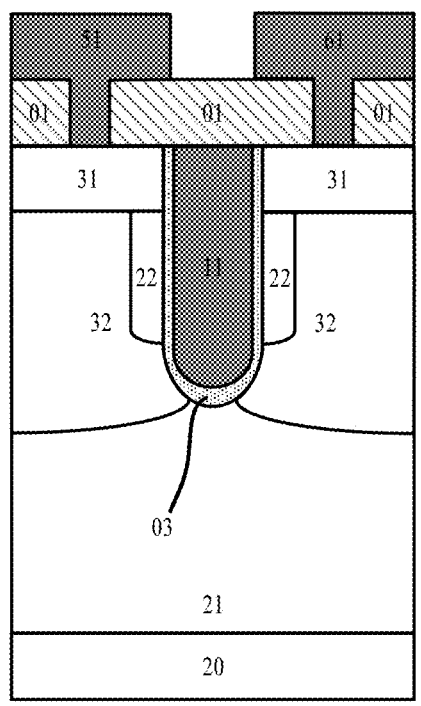
Figure 10B:
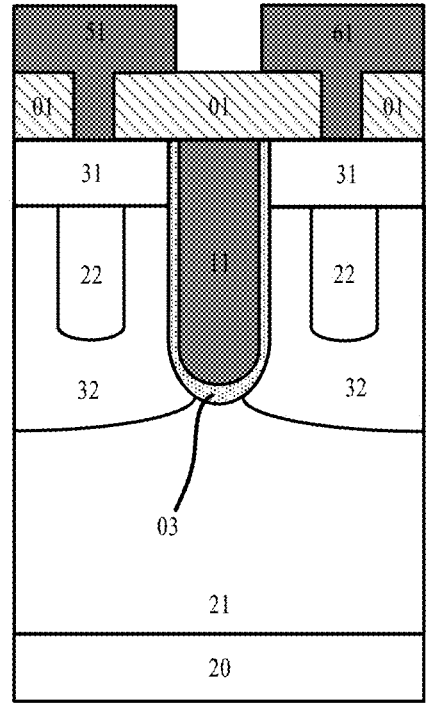
Figure 10C:
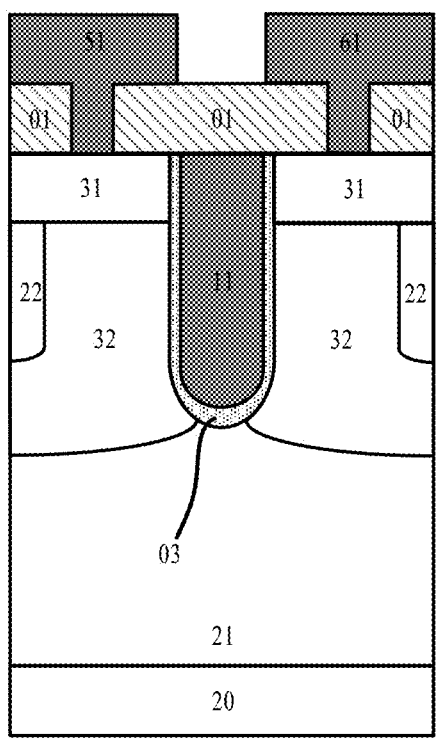

The bidirectional conduction trench gate power MOS device is shown in FIGS. 10A-10C, and the difference between the present embodiment and embodiment 1 is that: a second conductivity type doped region 22 is provided inside the first conductivity type lightly doped region 32, and the second conductivity type doped region 22 is at the left side, the middle or the right side inside the first conductivity type lightly doped region 32, and FIG. 10A, FIG. 10B, and FIG. 10C are respectively at the right side, the middle and the left side of the second conductivity type doped region 22 inside the first conductivity type lightly doped region 32.

As shown in FIGS. 19A-19E, the present embodiment also provides a method for manufacturing the above-mentioned bidirectional conduction trench gate power MOS device, comprising the following steps:

step 1, selecting a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type epitaxial layer 21 to form a U-shaped trench, as shown in FIG. 19A, and forming the gate oxide layer 03 and a first gate electrode polysilicon 11 in the trench, as shown in FIG. 19B;

step 4, forming a first conductivity type lightly doped region 32 on the surface of the second conductivity type epitaxial layer 21 by implanting first conductivity type impurity ions one or more times, wherein the bottom of the first conductivity type lightly doped region 32 is lower than the bottom of the trench.

step 5, forming a second conductivity type doped region 22 in the first conductivity type lightly doped region 32 by implanting second conductivity type impurity ions, as shown in FIG. 19C;

step 6, forming a first conductivity type heavily doped region 31 as shown in FIG. 19D on the surface of the first conductivity type lightly doped region 32 and the surface of the second conductivity type doped region 22 by implanting first conductivity type impurity ions one or more times, wherein the bottom of the first conductivity type heavily doped region 31 is lower than the top of the gate electrode polysilicon 11; and 0 step 7, forming a dielectric layer 01 and a contact hole as shown in FIG. 19D by a deposition, photolithography and etching process, performing surface metallizing, and forming a surface metal contact layer by a photolithography and etching process, so as to constitute a source electrode 51 and a drain electrode 61, as shown in FIG. 19E.

The introduction of the second conductivity type doped region 22 can further reduce the on-resistance of the device under the same voltage level, and can reduce the switching loss of the device; the difference between the structure and the structure in FIG. 9 is that the concentration of the second conductivity type epitaxial layer 21 and the concentration of the first conductivity type lightly doped region 32 are different, i.e. the region where the device participates in the main withstanding voltage is different, resulting in a different region where we introduce charge compensation; and moreover, the difference between the three cases in FIG. 10A, FIG. 10B, and FIG. 10C is the position of the introduced the second conductivity type lightly doped super junction bar, and the different positions have different effects on the assisted depletion of the first conductivity type.

Embodiment 6

Figure 11:
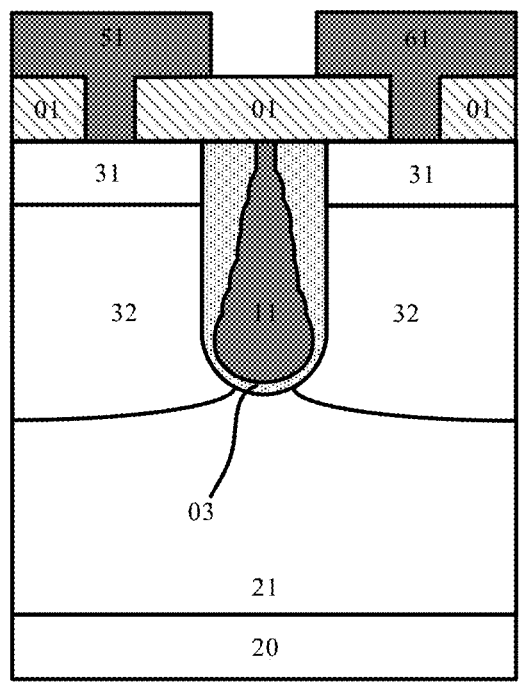
FIG. 11 is a schematic diagram corresponding to the bidirectional conduction trench gate power MOS device in embodiment 6.

As shown in FIG. 11, the present embodiment provides a bidirectional conduction trench gate power MOS device, and the difference between the present embodiment and embodiment 1 is that: the first gate electrode polysilicon 11 inside the trench is a stepped type, which is due to the special position of the inversion channel in this structure proposed by the present invention and the consideration of the thickness of the oxide layer and assisted depletion.

Embodiment 7

Figure 12:
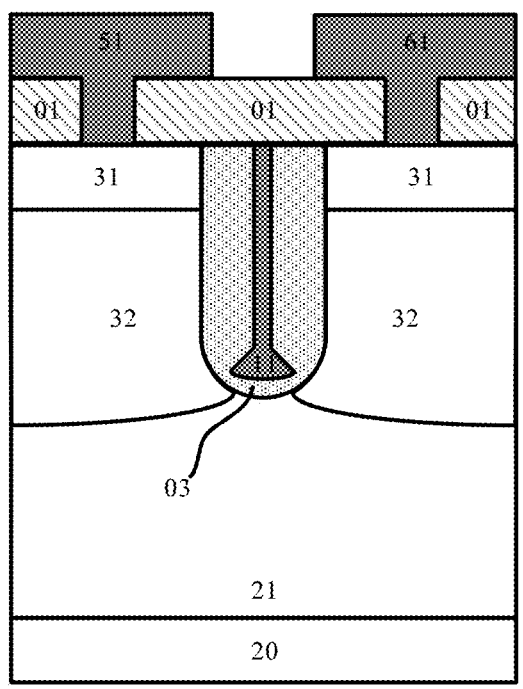
FIG. 12 is a schematic diagram corresponding to the bidirectional conduction trench gate power MOS device in embodiment 7.

As shown in FIG. 12, the present embodiment provides a bidirectional conduction trench gate power MOS device, and the difference between the present embodiment and embodiment 1 is that: the first gate electrode polysilicon 11 inside the trench is funnel-shaped, i.e. the polysilicon near the bottom of the trench is wider than the polysilicon above the trench; and this is due to the position of the inversion channel in this structure proposed by the present invention and the special application conditions.

Embodiment 8

Figure 13:
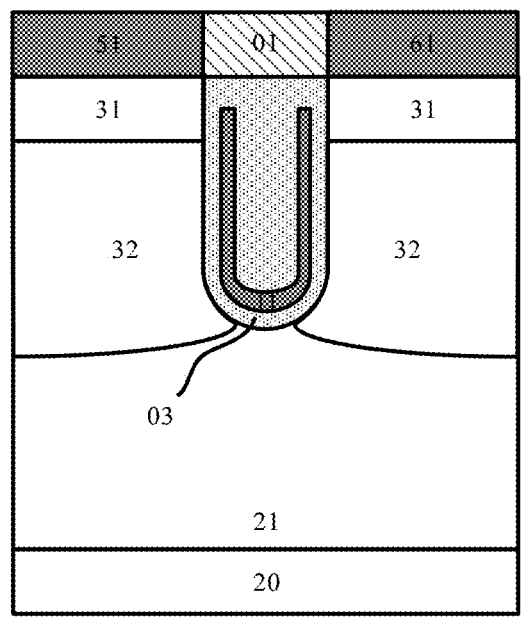
FIG. 13 is a schematic diagram corresponding to the bidirectional conduction trench gate power MOS device in embodiment 8.

As shown in FIG. 13, the present embodiment provides a bidirectional conduction trench gate power MOS device, and the difference between the present embodiment and embodiment 1 is that: the first gate electrode polysilicon 11 inside the trench is U-shaped; and the source electrode and the drain electrode are directly led out, which increases the contact area and thus reduces the contact resistance.

Embodiment 9

Figure 14:
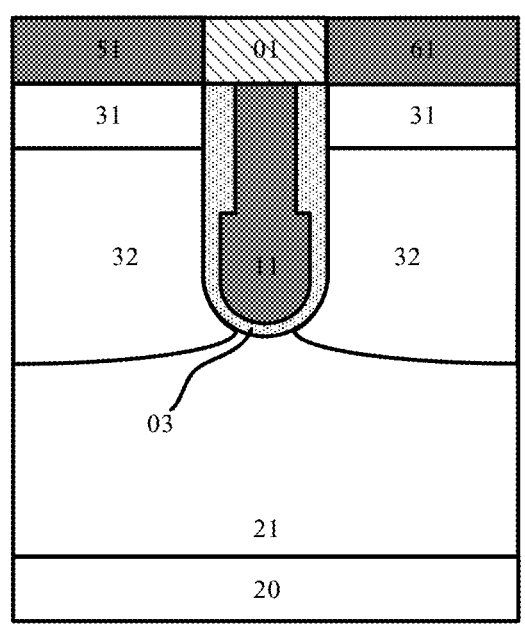
FIG. 14 is a schematic diagram corresponding to the bidirectional conduction trench gate power MOS device in embodiment 9.

As shown in FIG. 14, the present embodiment provides a bidirectional conduction trench gate power MOS device, and the difference between the present embodiment and embodiment 1 is that: the first gate electrode polysilicon 11 inside the trench is reduced surface field stepped oxide RSO (RESURF Stepped Oxide) type structure; and the source electrode and the drain electrode are directly led out, which increases the contact area and thus reduces the contact resistance.

Figure 20A:
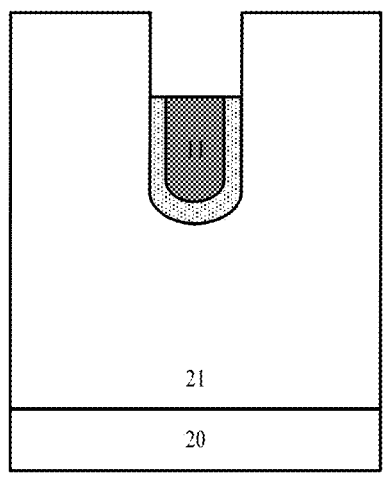
FIGS. 20A-20D are process flow diagrams corresponding to the manufacturing method in embodiment 9.
Figure 20B:
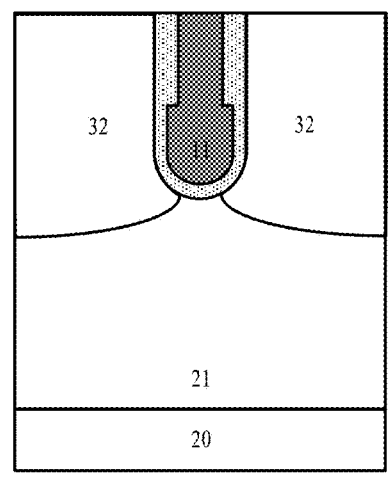
Figure 20C:
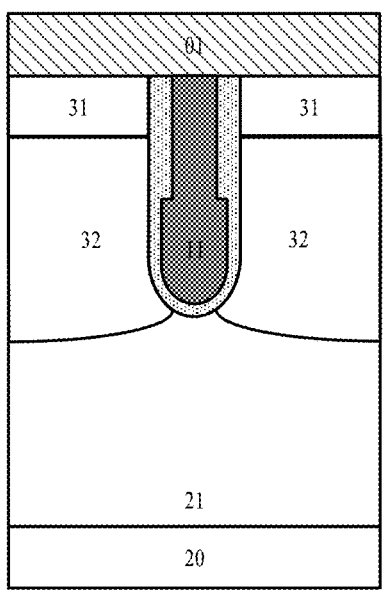
Figure 20D:
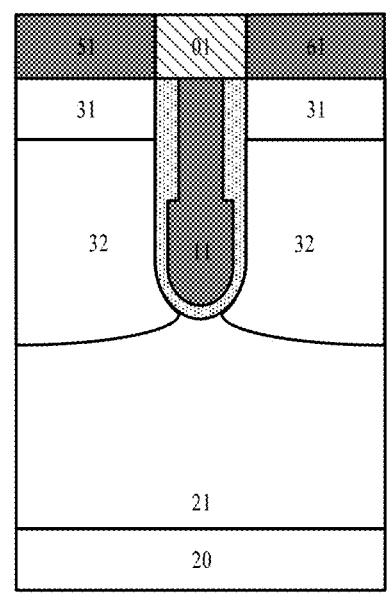

As shown in FIGS. 20A-20D, the present embodiment also provides a method for manufacturing the above-mentioned bidirectional conduction trench gate power MOS device, comprising the following steps:

step 1, selecting a second conductivity type heavily doped substrate 20;

step 2, epitaxially growing a second conductivity type epitaxial layer 21 on the surface of the second conductivity type heavily doped substrate 20;

step 3, performing photolithography and etching on the surface of the second conductivity type lightly doped epitaxial layer 21 to form a U-shaped trench, and forming a gate oxide layer 03 in the trench;

step 4, depositing polysilicon and performing back etching, and at the same time performing back etching on the oxide layer on the side wall of the trench; as shown in FIG. 20A;

step 5, performing growing an oxide layer in the trench, and depositing polysilicon to form a stepped first gate electrode polysilicon 11 one time;

step 6, forming a first conductivity type lightly doped region 32 on the surface of the second conductivity type epitaxial layer 21 by implanting first conductivity type impurity ions one or more times, as shown in FIG. 20B, wherein the bottom of the first conductivity type lightly doped region 32 is lower than the bottom of the trench;

step 7, forming a first conductivity type heavily doped region 31 as shown in FIG. 20C on the surface of the first conductivity type lightly doped region 32 by implanting first conductivity type impurity ions one or more times, wherein the bottom of the first conductivity type heavily doped region 31 is lower than the top of the first gate electrode polysilicon 11; and step 8, forming a dielectric layer 01 and a contact hole as shown in FIG. 20C by a deposition, photolithography and etching process, performing surface metallizing, and forming a surface metal contact layer by a photolithography and etching process, so as to constitute a source electrode 51 and a drain electrode 61, as shown in FIG. 20D.

Embodiment 10

Figure 15:
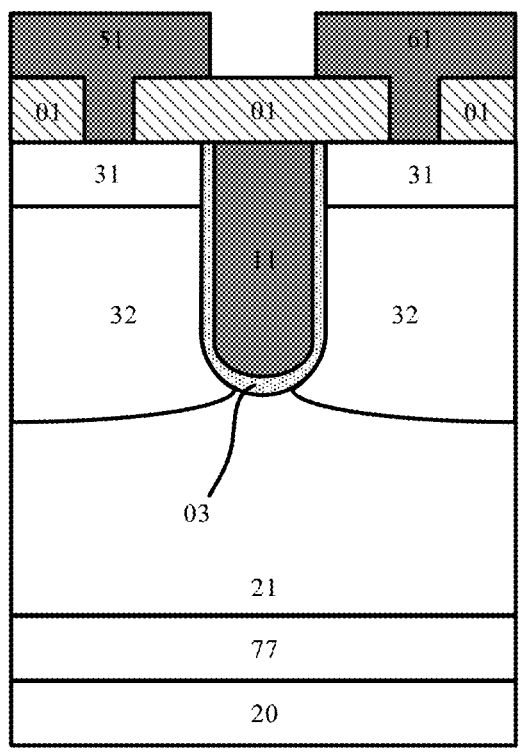
FIG. 15 is a schematic diagram corresponding to the bidirectional conduction trench gate power MOS device in embodiment 10.

As shown in FIG. 15, the present embodiment provides a bidirectional conduction trench gate power MOS device, and the difference between the present embodiment and embodiment 1 is that: a buried oxide layer 77 is provided between the second conductivity type heavily doped substrate 20 and the second conductivity type epitaxial layer 21. The introduction of the buried oxide layer avoids the consideration of the potential of the substrate, and the substrate can also be replaced with the first conductivity type heavy doped substrate.

Embodiment 11

Figure 16:
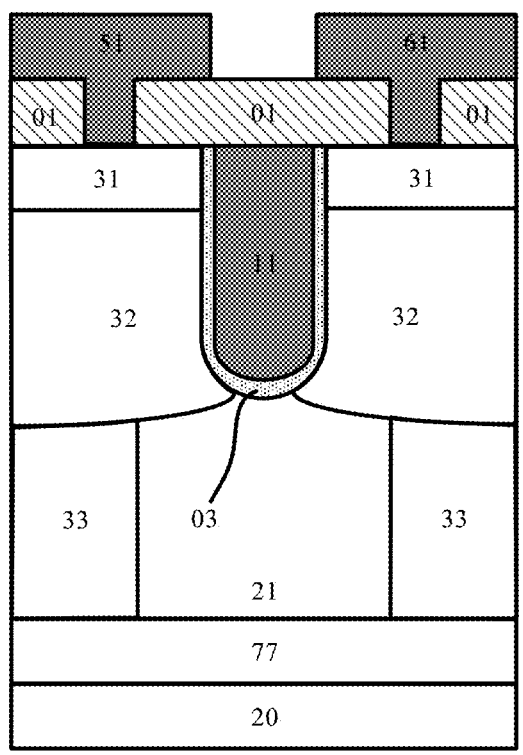
FIG. 16 is a schematic diagram corresponding to the bidirectional conduction trench gate power MOS device in embodiment 11.

As shown in FIG. 16, the present embodiment provides a bidirectional conduction trench gate power MOS device, and the difference between the present embodiment and embodiment 4 is that: a buried oxide layer 77 is provided between the second conductivity type heavily doped substrate 20 and the second conductivity type epitaxial layer 21. The introduction of the buried oxide layer can avoid the consideration of the substrate potential, and therefore the substrate can be replaced with the first conductivity type heavily doped substrate. In addition, the on-resistance of the device can be further reduced under the same voltage level due to the introduction of super junction structure.

The above-mentioned embodiments merely illustrate the principles and effects of the present invention, but are not intended to limit the present invention. Any person skilled in the art can modify or change the above-mentioned embodiments without departing from the spirit and scope of the present invention. Therefore, all equivalent modifications or changes made by those with ordinary knowledge in the field without departing from the spirit and technical idea disclosed in the present invention should still be covered by the claims of the present invention.

What is claimed is:

1. A bidirectional conduction trench gate power metal oxide semiconductor (MOS) device, comprising:
   a conductivity type heavily doped substrate, a conductivity type lightly doped epitaxial layer located on the conductivity type heavily doped substrate, a trench located on the conductivity type lightly doped epitaxial layer, and a gate electrode polysilicon located inside the trench, wherein a gate oxide layer is sandwiched between the gate electrode polysilicon and the trench, and a thickness of the gate oxide layer is determined by a gate electrode working potential;
   a conductivity type lightly doped region is located at two sides of the trench, wherein a bottom of the conductivity type lightly doped region is lower than a bottom of the trench; and a conductivity type heavily doped region is located on a surface of the conductivity type lightly doped region; and a dielectric layer on a surface of the conductivity type heavily doped region, and a source electrode and a drain electrode are led out from an upper part of the dielectric layer.

2. The bidirectional conduction trench gate power MOS device according to claim 1, wherein the bottom of the trench is implanted and annealed to form a conductivity type channel modulation region.

3. A method for manufacturing the bidirectional conduction trench gate power MOS device according to claim 2, comprising the following steps of:
step 1, selecting the conductivity type heavily doped substrate;
step 2, epitaxially growing the conductivity type lightly doped epitaxial layer on a surface of the conductivity type heavily doped substrate;
step 3, performing a photolithography and etching process on a surface of the conductivity type lightly doped epitaxial layer to form a U-shaped trench, and forming a sacrificial oxide layer in the U-shaped trench;
step 4, forming the conductivity type channel modulation region by implanting first conductivity type impurity ions one or more times into a channel region at a bottom of the U-shaped trench, and then performing a sacrificial oxygen etching;
step 5, forming the gate oxide layer in the U-shaped trench, and then depositing a polysilicon into the U-shaped trench to form the gate electrode polysilicon;
step 6, forming the conductivity type lightly doped region in the conductivity type lightly doped epitaxial layer by implanting second conductivity type impurity ions one or more times, wherein the bottom of the conductivity type lightly doped region is lower than the bottom of the U-shaped trench;
step 7, forming the conductivity type heavily doped region on the surface of the conductivity type lightly doped region by implanting the second conductivity type impurity ions one or more times, wherein a bottom of the conductivity type heavily doped region is lower than a top of the gate electrode polysilicon; and
step 8, forming the dielectric layer and a contact hole by a deposition, the photolithography and etching process, performing a surface metallizing, and forming a surface metal contact layer by the photolithography and etching process to constitute the source electrode and the drain electrode.

4. The bidirectional conduction trench gate power MOS device according to claim 2, wherein the source electrode and the drain electrode are interchanged.

5. The bidirectional conduction trench gate power MOS device according to claim 2, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

6. The bidirectional conduction trench gate power MOS device according to claim 1, wherein a split gate electrode polysilicon is provided above the gate electrode polysilicon inside the trench.

7. The bidirectional conduction trench gate power MOS device according to claim 6, wherein the source electrode and the drain electrode are interchanged.

8. The bidirectional conduction trench gate power MOS device according to claim 6, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

9. The bidirectional conduction trench gate power MOS device according to claim 1, wherein a conductivity type doped region is provided inside the conductivity type lightly doped region, and the conductivity type doped region is at a side, a middle or a right side inside the conductivity type lightly doped region.

10. The bidirectional conduction trench gate power MOS device according to claim 9, wherein the source electrode and the drain electrode are interchanged.

11. The bidirectional conduction trench gate power MOS device according to claim 9, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

12. The bidirectional conduction trench gate power MOS device according to claim 1, wherein a buried oxide layer is provided between the conductivity type heavily doped substrate and the conductivity type lightly doped epitaxial layer.

13. The bidirectional conduction trench gate power MOS device according to claim 12, wherein the source electrode and the drain electrode are interchanged.

14. The bidirectional conduction trench gate power MOS device according to claim 12, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

15. The bidirectional conduction trench gate power MOS device according to claim 1, wherein the gate electrode polysilicon inside the trench is a stepped type structure, or a funnel-shaped structure, or a U-shaped structure, or a reduced surface field stepped oxide (RSO) type structure.

16. The bidirectional conduction trench gate power MOS device according to claim 15, wherein the source electrode and the drain electrode are interchanged.

17. The bidirectional conduction trench gate power MOS device according to claim 15, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

18. The bidirectional conduction trench gate power MOS device according to claim 1, wherein the source electrode and the drain electrode are interchanged.

19. The bidirectional conduction trench gate power MOS device according to claim 1, wherein
a first conductivity type is an n-type doping and a second conductivity type is a p-type doping when the bidirectional conduction trench gate power MOS device is a N-type channel MOS;
the first conductivity type is the p-type doping and the second conductivity type is the n-type doping when the bidirectional conduction trench gate power MOS device is a P-type channel MOS;
and/or a heavily doped doping concentration is greater than 1E19 and a lightly doped doping concentration is less than 1E18.

20. A method for manufacturing the bidirectional conduction trench gate power MOS device according to claim 1, comprising:

step 1, selecting the conductivity type heavily doped substrate;

step 2, epitaxially growing the conductivity type lightly doped epitaxial layer on a surface of the conductivity type heavily doped substrate;

step 3, performing a photolithography and etching process on a surface of the conductivity type lightly doped epitaxial layer to form a U-shaped trench, and forming the gate oxide layer and the gate electrode polysilicon in the U-shaped trench;

step 4, forming the conductivity type lightly doped region on the surface of the conductivity type lightly doped epitaxial layer by implanting conductivity type impurity ions one or more times, wherein the bottom of the conductivity type lightly doped region is lower than a bottom of the U-shaped trench;

step 5, forming the conductivity type heavily doped region on the surface of the conductivity type lightly doped region by implanting the conductivity type impurity ions one or more times, wherein a bottom of the conductivity type heavily doped region is lower than a top of the gate electrode polysilicon; and step 6, forming the dielectric layer and a contact hole by a deposition, the photolithography and etching process, performing a surface metallizing, and forming a surface metal contact layer by the photolithography and etching process to constitute the source electrode and the drain electrode.

* * * * *